(12) United States Patent
Dornbos et al.

(10) Patent No.: US 6,534,848 B1
(45) Date of Patent: Mar. 18, 2003

(54) ELECTRICAL COUPLING OF A STIFFENER TO A CHIP CARRIER

(75) Inventors: Terry J. Dornbos, Vestal, NY (US); Raymond A. Phillips, Jr., Vestal, NY (US); Mark V. Pierson, Binghamton, NY (US); William J. Rudik, Vestal, NY (US); David L. Thomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 09/657,194

(22) Filed: Sep. 7, 2000

(51) Int. Cl.$^7$ ............................................... H01L 23/02
(52) U.S. Cl. ...................................... 257/678; 257/706
(58) Field of Search ............................... 257/678, 706, 257/707, 718, 719, 787, 796

(56) References Cited

U.S. PATENT DOCUMENTS

| | | | | |
|---|---|---|---|---|
| 5,535,526 A | * | 7/1996 | White | 228/180.22 |
| 5,665,650 A | | 9/1997 | Lauffer et al. | |
| 5,776,512 A | * | 7/1998 | Weber | 249/91 |
| 5,877,552 A | | 3/1999 | Chiang | |
| 6,121,070 A | * | 9/2000 | Akram | 438/106 |

FOREIGN PATENT DOCUMENTS

JP 2000-232260 * 8/2000

* cited by examiner

*Primary Examiner*—Nathan J. Flynn
*Assistant Examiner*—Leonardo Andújar
(74) *Attorney, Agent, or Firm*—Schmeiser, Olsen & Watts; Lawrence R. Fraley

(57) ABSTRACT

A method and structure for conductively coupling a metallic stiffener to a chip carrier. A substrate has a conductive pad on its surface and an adhesive layer is formed on the substrate surface. The metallic stiffener is placed on the adhesive layer, wherein the adhesive layer mechanically couples the stiffener to the substrate surface and electrically couples the stiffener to the pad. The adhesive layer is then cured such as by pressurization at elevated temperature. Embodiments of the present invention form the adhesive layer by forming an electrically conductive contact on the pad and setting a dry adhesive on the substrate, such that the electrically conductive contact is within a hole in the dry adhesive. The electrically conductive contact electrically couples the stiffener to the pad. The curing step includes curing both the dry adhesive and the electrically conductive contact, resulting in the dry adhesive adhesively coupling the stiffener to the substrate. The electrically conductive contact may include an electrically conductive adhesive or a metallic solder. Additional embodiments of the present invention form the adhesive layer by applying an electrically conductive adhesive on the substrate, wherein after the stiffener is placed on the adhesive layer, the electrically conductive adhesive mechanically and electrically couples the stiffener to the surface of the substrate.

19 Claims, 3 Drawing Sheets

ELECTRICAL COUPLING OF A STIFFENER TO A CHIP CARRIER

BACKGROUND OF THE INVENTION

1. Technical Field

The present invention relates to a method and structure for conductively coupling a metallic stiffener to a chip carrier.

2. Related Art

A metallic stiffener may be placed on a chip carrier to reduce bending and other deformations of the chip carrier. For some applications, it may be desirable to provide electrically conductive coupling between the metallic stiffener and the chip carrier. Thus, there is a need to provide a method and structure for conductively coupling a metallic stiffener to the chip carrier.

SUMMARY OF THE INVENTION

The present invention provides an electronic structure, comprising:
- a substrate having a first electrically conductive pad on a surface of the substrate;
- an electrically conductive stiffener; and
- an adhesive layer that mechanically couples the stiffener to the surface of the substrate and electrically couples the stiffener to the first electrically conductive pad.

The present invention provides an electronic structure, comprising:
- a substrate having a first electrically conductive pad on a surface of the substrate; and
- a layer of uncured dry adhesive on the substrate, wherein a hole in the uncured dry adhesive includes an uncured electrically conductive contact, and wherein the electrically conductive contact is electrically coupled to the first electrically conductive pad.

The present invention provides a method of forming an electronic structure, comprising:
- providing a substrate having a first electrically conductive pad on a surface of the substrate;
- forming an uncured adhesive layer on the surface of the substrate;
- placing an electrically conductive stiffener on the adhesive layer, wherein the uncured adhesive layer mechanically couples the stiffener to the surface of the substrate and electrically couples the stiffener to the first electrically conductive pad; and
- curing the uncured adhesive layer.

The present invention provides a method and structure for conductively coupling a metallic stiffener to the chip carrier.

DETAILED DESCRIPTION OF THE INVENTION

Figure 1:
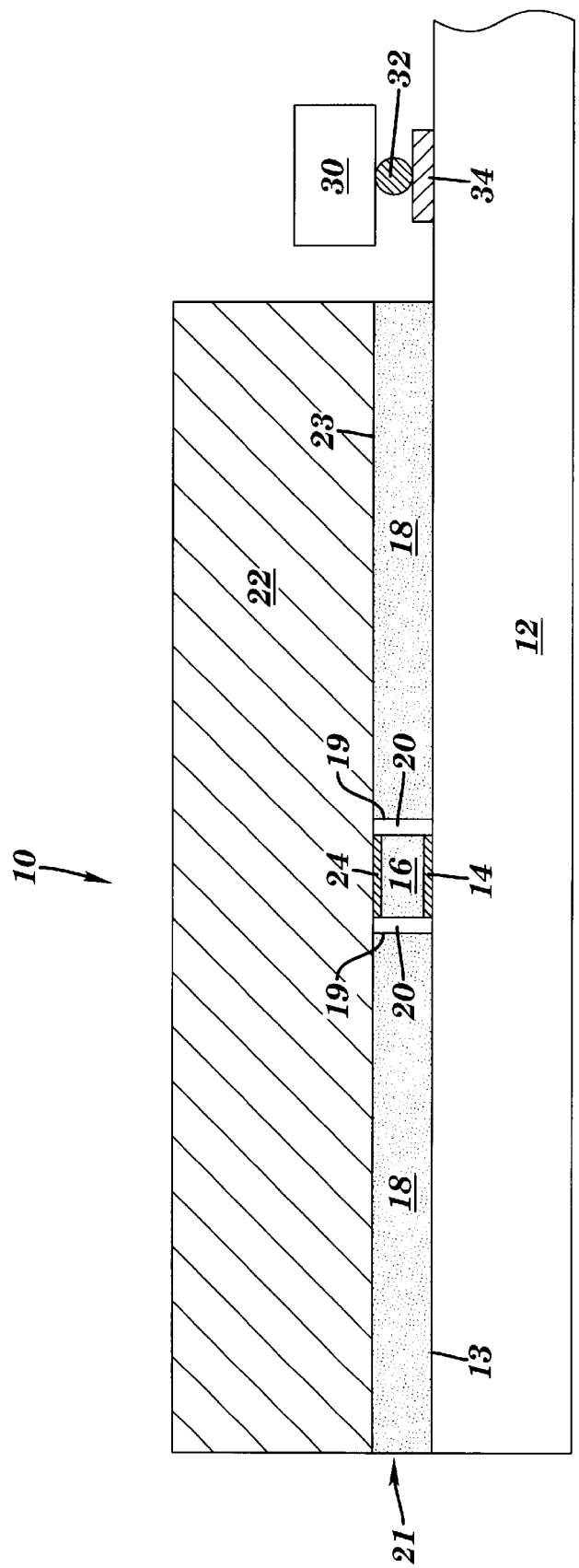
FIG. 1 depicts a front cross-sectional view of an electronic structure, in accordance with first embodiments of the present invention.

FIG. 1 illustrates a front cross-sectional view of an electronic structure 10, in accordance with first embodiments of the present invention. Fabricating the electronic structure 10 includes providing a substrate 12 having an electrically conductive pad 14 on a surface 13 of the substrate 12, forming an adhesive layer 21 on the surface 13 of the substrate 12, placing an electrically conductive stiffener 22 on the adhesive layer 21, and curing the adhesive layer 21. The substrate 12 may include, inter alia, a laminate such as a chip carrier. The electrically conductive pad 14 may include, inter alia, a conductive metal such as gold or palladium that does not oxidize at room temperature.

The adhesive layer 21 may be formed on the surface 13 of the substrate 12 by applying an electrically conductive adhesive 16 to the pad 14, and setting a dry adhesive 18 on the surface 13 such that the electrically conductive adhesive 16 is within a hole 19 in the dry adhesive 18. Within the hole 19, there may be a gap or space 20 between the electrically conductive adhesive 16 and the dry adhesive 18. The gap or space 20 provides clearance that enables the electrically conductive adhesive 16 to be free of interference from the dry adhesive 18, and allows room for accommodating mechanical misalignment between the substrate 12 and the electrically conductive stiffener 22. The electrically conductive adhesive 16 may be applied to the pad 14 before setting the dry adhesive 18 on the surface 13. Alternatively, the dry adhesive 18 may be set upon the surface 13 before the electrically conductive adhesive 16 is applied within the hole 19 to the pad 14. The electrically conductive adhesive 16 may include, inter alia, a thermoset adhesive with included silver particles, such as that produced by ABLESTIK as product number RP-507-30. The dry adhesive 18 may be conductive or nonconductive and may include, inter alia, an internal polyimide layer sandwiched between outer layers of an acrylic, such as that produced by E.I. duPont Nemoirs and Company as PYRALUX® LF-131. Other dry adhesive 18 materials that could be used include an expanded and filled teflon such as that produced by W. L. Gore and Associates as product number GST-5020.

The electrically conductive stiffener 22 is placed on the adhesive layer 21 such that: the electrically conductive adhesive 16 conductively contacts an electrically conductive pad 24 that is on a surface 23 of the stiffener 22; and the dry adhesive 18 mechanically couples the stiffener 22 to the surface 13 of the substrate 12. The stiffener 12 comprises a conductive material, such as a metal, that is capable of being adhesively coupled to the electrically conductive adhesive 16 and to the dry adhesive 18 upon subsequent curing of the electrically conductive adhesive 16 and the dry adhesive 18, respectively. The stiffener 22 may include, inter alia, a metallic material such as stainless steel, copper, nickel, or titanium.

Curing the adhesive layer 21 includes curing both the dry adhesive 18 and the electrically conductive adhesive 16. Curing the adhesive layer 21 may be accomplished by any method known to one of ordinary skill in the art, such as by pressurization at an elevated temperature. The pressurization may be accomplished, inter alia, by placing the electronic structure 10 within a sealed enclosure, depressurizing a space within the enclosure by forming a partial vacuum inside the enclosure, and externally applying an external mechanical pressure (i.e., a compressive stress) on the enclosure from outside the enclosure so as to compressively stress the electronic structure 10, and particularly the electrically conductive adhesive 16 and the dry adhesive 18. The externally applied mechanical pressure on the enclosure is accompanied by heating the electronic structure 10 within the enclosure. Many combinations of external pressure upon the enclosure and elevated temperature within the enclosure are within the scope of the present invention. For example, an external pressure of about 300 psi may be employed together with an enclosure temperature of about 150° C. for about two hours. The curing of the dry adhesive 18 causes the dry adhesive 18 to adhesively couple the stiffener 22 to the surface 13 of the substrate 12. The curing of the electrically conductive adhesive 16 causes the electrically conductive adhesive 16 to adhesively and electrically couple the pad 24 to the pad 14. The electrically conductive adhesive 16 is an example of an electrically conductive contact that could be used for electrically coupling the stiffener 22 to the pad 14.

After the curing of the adhesive layer 21, an electronic device 30 may be coupled to the surface 13 of the substrate 12. Such coupling may be accomplished by any method known to one of ordinary skill in the art, such as by, inter alia, interfacing a conductive interface 32 between the electronic device 30 and an electronically conductive pad 34 that is on the surface 13 of the substrate 12. As an example, the electronic device 30 may include a semiconductor chip, and the conductive interface 32 may include a controlled collapse chip connection (C4) solder ball.

Figure 2:
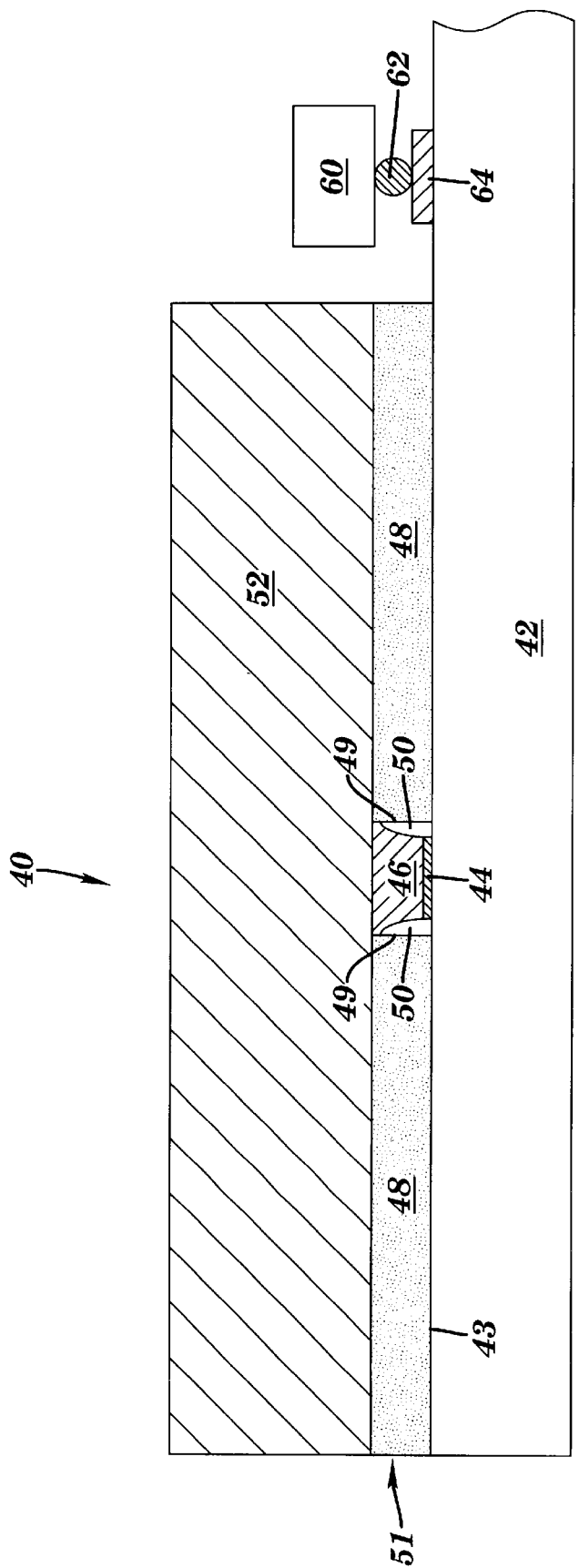
FIG. 2 depicts a front cross-sectional view of an electronic structure, in accordance with second embodiments of the present invention.

FIG. 2 illustrates a front cross-sectional view of an electronic structure 40, in accordance with second embodiments of the present invention. Fabricating the electronic structure 40 includes providing a substrate 42 having an electrically conductive pad 44 on a surface 43 of the substrate 42, forming an adhesive layer 51 on the surface 43 of the substrate 42, placing an electrically conductive stiffener 52 on the adhesive layer 51, and curing the adhesive layer 51. The substrate 42 may include, inter alia, a laminate such as a chip carrier. The electrically conductive pad 44 may include, inter alia, a conductive metal, such as gold or palladium, that does not oxidize at room temperature. Alternatively, the electrically conductive pad 44 may include, inter alia, a conductive metal (e.g., copper) that is solder coated such that the conductive metal would not be exposed to air, and thus could not oxidize, at room temperature.

The adhesive layer 51 may be formed on the surface 43 of the substrate 42 by applying a metallic solder 46 (in a form of a solder volume such as a solder sphere) to the pad 44, and setting a dry adhesive 48 on the surface 43 such that the metallic solder 46 is within a hole 49 in the dry adhesive 48. The metallic solder 46 may include, inter alia, a eutectic alloy of lead and tin (i.e., a lead/tin ratio of about 63/37 by weight with a melting temperature of about 183° C.). Within the hole 49, there may be a gap or space 50 between the metallic solder 46 and the dry adhesive 48. The gap or space 50 provides clearance that enables the metallic solder 46 to move when reflowed by heating. The metallic solder 46 may be applied to the pad 44 before setting the dry adhesive 48 on the surface 43. Alternatively, the dry adhesive 48 may be set upon the surface 43 before the metallic solder 46 is applied within the hole 49 to the pad 44. The metallic solder 46 may include, inter alia, a eutectic lead/tin alloy. The dry adhesive 48 may be conductive or nonconductive and may include, inter alia, an internal polyimide layer sandwiched between outer layers of an acrylic, such as that produced by E.I. dupont Nemoirs and Company as PYRALUX® LF-131. Other dry adhesive 48 materials that could be used include an expanded and filled teflon such as that produced by W.L. Gore and Associates as product number GST-5020.

The electrically conductive stiffener 52 is placed on the adhesive layer 51 such that: the metallic solder 46 conductively interfaces the stiffener 52 with the pad 44; and the dry adhesive 48 mechanically couples the stiffener 52 to the surface 43 of the substrate 42. The stiffener 52 comprises a conductive material, such as a metal, that is solder wettable to the metallic solder 46 and is capable of being adhesively coupled to the dry adhesive 48 upon subsequent curing of the dry adhesive 48. The stiffener 52 may include, inter alia, a solder wettable metallic material (e.g., series 400 stainless steel), or a metallic material with a solderable plating surface thereon (e.g., 300 series stainless steel having a gold plating surface thereon, copper having a nickel plating surface thereon). The stiffener 52 serves to provide a flat, rigid surface to diminish a non-planarity of the substrate 12.

Curing the adhesive layer 51 includes curing the dry adhesive 48. The curing of the adhesive layer 51 may be accomplished by any method known to one of ordinary skill in the art such as by pressurization at an elevated temperature. The pressurization may be accomplished, inter alia, by placing the electronic structure 40 within a sealed enclosure, depressurizing a space within the enclosure by forming a partial vacuum inside the enclosure, and externally applying an external mechanical pressure (i.e., a compressive stress) on the enclosure from outside the enclosure so as to compressively stress the electronic structure 40, and particularly the dry adhesive 48. The externally applied mechanical pressure on the enclosure is accompanied by heating the electronic structure 40 within the enclosure. Many combinations of external pressure upon the enclosure and elevated temperature within the enclosure are within the scope of the present invention. For example, an external pressure of about 300 psi may be employed together with an enclosure temperature that is high enough (e.g., 200° C.) to reflow the metallic solder 46 for a sufficient period of time (e.g., about two hours). Thus, a minimum acceptable enclosure temperature depends on a metallic composition of the metallic solder 46. The curing of the dry adhesive 48 causes the dry adhesive 48 to adhesively couple the stiffener 52 to the surface 43 of the substrate 42. The heating that occurs during the curing reflows the metallic solder 46. During the reflow of the metallic solder 46, the dry adhesive 48 acts as a solder stop and a solder gasket, and the reflowed metallic solder 46 solderably adheres to the stiffener 52 while liquified. Thus, the heating during curing causes the metallic solder 46 to adhesively and electrically couple the stiffener 52 to the pad 44. The metallic solder 46 is an example of an electrically conductive contact that could be used for electrically coupling the stiffener 52 to the pad 44.

After the curing of the adhesive layer 51, an electronic device 60 may be coupled to the surface 43 of the substrate 42. Such coupling may be accomplished by any method known to one of ordinary skill in the art, such as by, inter alia, interfacing a conductive interface 62 between the electronic device 60 and an electronically conductive pad 64 that is on the surface 43 of the substrate 42. As an example, the electronic device 60 may include a semiconductor chip, and the conductive interface 62 may include a controlled collapse chip connection (C4) solder ball.

Figure 3:
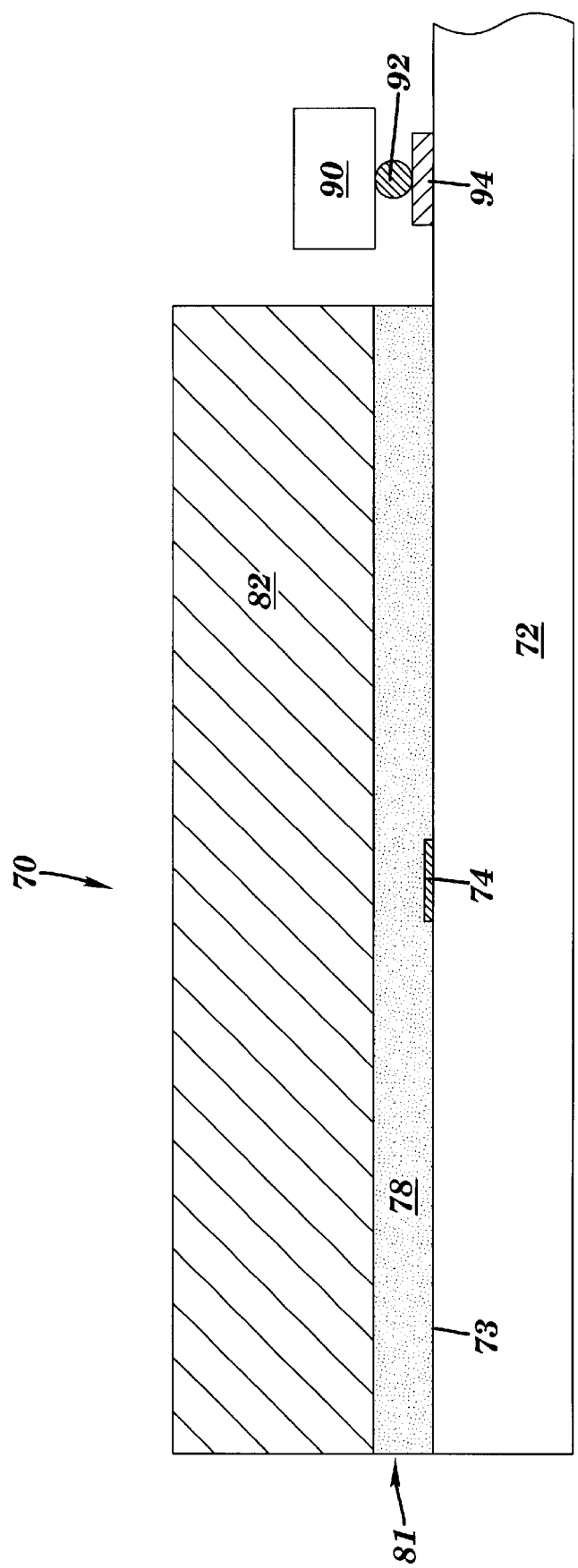
FIG. 3 depicts a front cross-sectional view of an electronic structure, in accordance with third embodiments of the present invention.

FIG. 3 illustrates a front cross-sectional view of an electronic structure 70, in accordance with third embodiments of the present invention. Fabricating the electronic structure 70 includes providing a substrate 72 having an electrically conductive pad 74 on a surface 73 of the substrate 72, forming an adhesive layer 81 on the surface 73 of the substrate 72, placing an electrically conductive stiffener 82 on the adhesive layer 81, and curing the adhesive layer 81. The substrate 72 may include, inter alia, a laminate such as a chip carrier. The electrically conductive pad 74 may include, inter alia, a conductive metal such as gold or palladium that does not oxidize at room temperature.

The adhesive layer 81 may be formed on the surface 73 of the substrate 72 by applying an electrically conductive adhesive 78 to the surface 73 of the substrate 72. The electrically conductive adhesive 78 may include, inter alia, metallic particles dispersed within an epoxy material (e.g., a dry tape epoxy having dispersed silver particles therein, such as that produced by AI Technology Inc. as product number ZEF8410-FP).

The electrically conductive stiffener 82 is placed on the adhesive layer 81 such that: the stiffener 82 conductively contacts the electrically conductive adhesive 78; and the electrically conductive adhesive 78 mechanically couples the stiffener 82 to the surface 73 of the substrate 72. The stiffener 72 comprises a conductive material, such as a metal, that is capable of being adhesively and conductively coupled to the electrically conductive adhesive 78 upon subsequent curing of the electrically conductive adhesive 78. The stiffener 82 may include, inter alia, a metallic material covered with a gold or palladium.

Curing the adhesive layer 81 includes curing the electrically conductive adhesive 78. The curing of the electrically conductive adhesive 78 may be accomplished by any method known to one of ordinary skill in the art such as by force or pressurization at an elevated temperature. The pressurization may be accomplished, inter alia, by placing the electronic structure 70 within a sealed enclosure, depressurizing a space within the enclosure by forming a partial vacuum inside the enclosure, and externally applying an external mechanical pressure (i.e., a compressive stress) on the enclosure from outside the enclosure so as to compressively stress the electronic structure 70, and particularly the electrically conductive adhesive 78. The externally applied mechanical pressure on the enclosure is accompanied by heating the electronic structure 70 within the enclosure. Many combinations of external pressure upon the enclosure and elevated temperature within the enclosure are within the scope of the present invention. For example, an external pressure of about 100 psi may be employed together with an enclosure temperature of about 160° C. for about 1 minute. The curing of the electrically conductive adhesive 78 causes the electrically conductive adhesive 78 to adhesively and electrically couple the stiffener 82 to the surface 73 of the substrate 72. As another example, an external pressure of about 100 psi may be employed together with heated plates at about 160° C. for about 1 minute, wherein the heated plates are applied to the electronic structure 70.

After the curing of the adhesive layer 81, an electronic device 90 may be coupled to the surface 73 of the substrate 72. Such coupling may be accomplished by any method known to one of ordinary skill in the art, such as by, inter alia, interfacing a conductive interface 92 between the electronic device 90 and an electronically conductive pad 94 that is on the surface 73 of the substrate 72. As an example, the electronic device 90 may include a semiconductor chip, and the conductive interface 92 may include a controlled collapse chip connection (C4) solder ball.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:
a substrate having a first electrically conductive pad on a surface of the substrate;
an electrically conductive stiffener; and
an adhesive layer that mechanically couples the stiffener to the surface of the substrate and electrically couples the stiffener to the first electrically conductive pad, wherein the adhesive layer comprises a dry adhesive that mechanically couples the stiffener to the surface of the substrate, wherein a hole in the dry adhesive includes an electrically conductive contact, wherein the electrically conductive contact electrically couples the stiffener to the first electrically conductive pad, and wherein the hole includes a gap between the dry adhesive and the electrically conductive contact.

2. The electronic structure of claim 1, wherein the dry adhesive is uncured, and wherein the electrically conductive contact is uncured.

3. The electronic structure of claim 1, wherein the dry adhesive is cured and adhesively couples the stiffener to the surface of the substrate, and wherein the electrically conductive contact is cured.

4. The electronic structure of claim 1, wherein the electrically conductive contact includes a metallic solder.

5. The electronic structure of claim 4, wherein the stiffener includes a conductive material that is solder wettable to the metallic solder and is capable of being adhesively coupled to the dry adhesive upon curing of the dry adhesive.

6. The electronic structure of claim 1, wherein the dry adhesive is electrically nonconductive or electrically conductive.

7. The electronic structure of claim 1, wherein the dry adhesive is selected from the group consisting of an internal polyimide layer sandwiched between outer layers of an acrylic and expanded and filled polytetrafluroethylene.

8. An electronic structure, comprising:
a substrate having a first electrically conductive pad on a surface of the substrate;
an electrically conductive stiffener; and
an adhesive layer that mechanically couples the stiffener to the surface of the substrate and electrically couples the stiffener to the first electrically conductive pad, wherein the adhesive layer comprises a dry adhesive that mechanically couples the stiffener to the surface of the substrate, wherein a hole in the dry adhesive includes an electrically conductive contact, wherein the electrically conductive contact electrically couples the stiffener to the first electrically conductive pad, wherein the electrically conductive contact includes an electrically conductive adhesive, and wherein a surface of the stiffener includes a second electrically conductive pad that electrically couples the stiffener to the electrically conductive adhesive.

9. The electronic structure of claim 8, wherein the electrically conductive adhesive comprises a thermoset adhesive that includes silver particles.

10. The electronic structure of claim 8, wherein the stiffener includes a conductive material that is capable of being adhesively coupled to the electrically conductive adhesive and to the dry adhesive upon curing of the electrically conductive adhesive and the dry adhesive, respectively.

11. An electronic structure, comprising:
a substrate having a first electrically conductive pad on a surface of the substrate;
an electrically conductive stiffener;
an adhesive layer that mechanically couples the stiffener to the surface of the substrate and electrically couples the stiffener to the first electrically conductive pad;

a second electrically conductive pad on the substrate; and an electronic device coupled to the second electrically conductive pad.

12. The electronic structure of claim 11, wherein the adhesive layer comprises an electrically conductive adhesive that mechanically and electrically couples the stiffener to the surface of the substrate.

13. The electronic structure of claim 12, wherein the electrically conductive adhesive is uncured.

14. The electronic structure of claim 12, wherein the electrically conductive adhesive is cured.

15. The electronic structure of claim 12, wherein the electrically conductive adhesive includes metallic particles dispersed within an epoxy material.

16. The electronic structure of claim 12, wherein the stiffener includes a conductive material that is capable of being adhesively coupled to the electrically conductive adhesive upon curing of the electrically conductive adhesive.

17. The electronic structure of claim 11, wherein the electronic device includes a semiconductor chip.

18. An electronic structure, comprising:

a substrate having a first electrically conductive pad on a surface of the substrate; and a layer of uncured dry adhesive on the substrate, wherein a hole in the uncured dry adhesive includes an uncured electrically conductive contact, wherein the electrically conductive contact is electrically coupled to the first electrically conductive pad, and wherein the hole includes a gap between the uncured dry adhesive and the uncured electrically conductive contact.

19. The electronic structure of claim 18, wherein the uncured electrically conductive contact is selected from the group consisting of a electrically conductive adhesive and a metallic solder.

* * * * *